US010834845B2

(12) United States Patent
Yang

(10) Patent No.: US 10,834,845 B2
(45) Date of Patent: Nov. 10, 2020

(54) GUIDE ROBOT

(71) Applicant: LG ELECTRONICS INC., Seoul (KR)

(72) Inventor: Sunho Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/499,461

(22) PCT Filed: Jun. 26, 2018

(86) PCT No.: PCT/KR2018/007201
§ 371 (c)(1),
(2) Date: Sep. 30, 2019

(87) PCT Pub. No.: WO2019/009555
PCT Pub. Date: Jan. 10, 2019

(65) Prior Publication Data
US 2020/0029461 A1    Jan. 23, 2020

(30) Foreign Application Priority Data
Jul. 5, 2017    (KR) .......................... 10-2017-0085453

(51) Int. Cl.
*H05K 7/20* (2006.01)
*B25J 19/00* (2006.01)
(Continued)

(52) U.S. Cl.
CPC ...... *H05K 7/20172* (2013.01); *B25J 19/0054* (2013.01); *G06F 1/16* (2013.01);
(Continued)

(58) Field of Classification Search
CPC .............................. H05K 7/20172; G06F 1/16
See application file for complete search history.

(56) References Cited

U.S. PATENT DOCUMENTS

2006/0128261 A1* 6/2006 Kawabe ............... B25J 19/0054
446/268
2012/0061155 A1* 3/2012 Berger ..................... B25J 5/007
180/21
(Continued)

FOREIGN PATENT DOCUMENTS

CN          202511816      10/2012
KR      20-2000-0018329    10/2000
(Continued)

OTHER PUBLICATIONS

International Search Report dated Oct. 12, 2018 issued in Application No. PCT/KR2018/007201.

*Primary Examiner* — Mukundbhai G Patel
(74) *Attorney, Agent, or Firm* — Ked & Associates, LLP

(57) ABSTRACT

A guidance robot according to an embodiment of the present disclosure includes a display, a head case configured to be provided to be capable of rotating, an upper case configured to couple to the display and the head case, the upper case being configured to receive an electronic component and a cooling fan therein, and a lower case configured to be located on a lower side of the upper case, the lower case being configured to locate a wheel and a motor therein. In addition, when the cooling fan is driven, outside air is suctioned through a gap between a lower end portion of the head case and an upper-end portion of the upper case, and the suctioned air passes through the electronic component and then is discharged to the outside through the gap between the lower end portion of the upper case and the upper-end portion of the lower case.

13 Claims, 14 Drawing Sheets

(51) Int. Cl.
  *G06F 1/16* (2006.01)
  *H05K 5/00* (2006.01)
  *H05K 5/02* (2006.01)
(52) U.S. Cl.
  CPC ......... *H05K 5/0017* (2013.01); *H05K 5/0217* (2013.01); *H05K 7/20863* (2013.01)

(56) References Cited

U.S. PATENT DOCUMENTS

| | | |
|---|---|---|
| 2014/0251702 A1 | 9/2014 | Berger et al. |
| 2015/0190927 A1* | 7/2015 | Sutherland .............. H04W 4/70 700/259 |
| 2016/0114488 A1 | 4/2016 | Mascorro Medina et al. |

FOREIGN PATENT DOCUMENTS

| | | |
|---|---|---|
| KR | 10-1193610 | 10/2012 |
| KR | 10-2017-0056718 | 5/2017 |
| WO | WO 2016/065362 | 4/2016 |

\* cited by examiner

[Fig. 1]
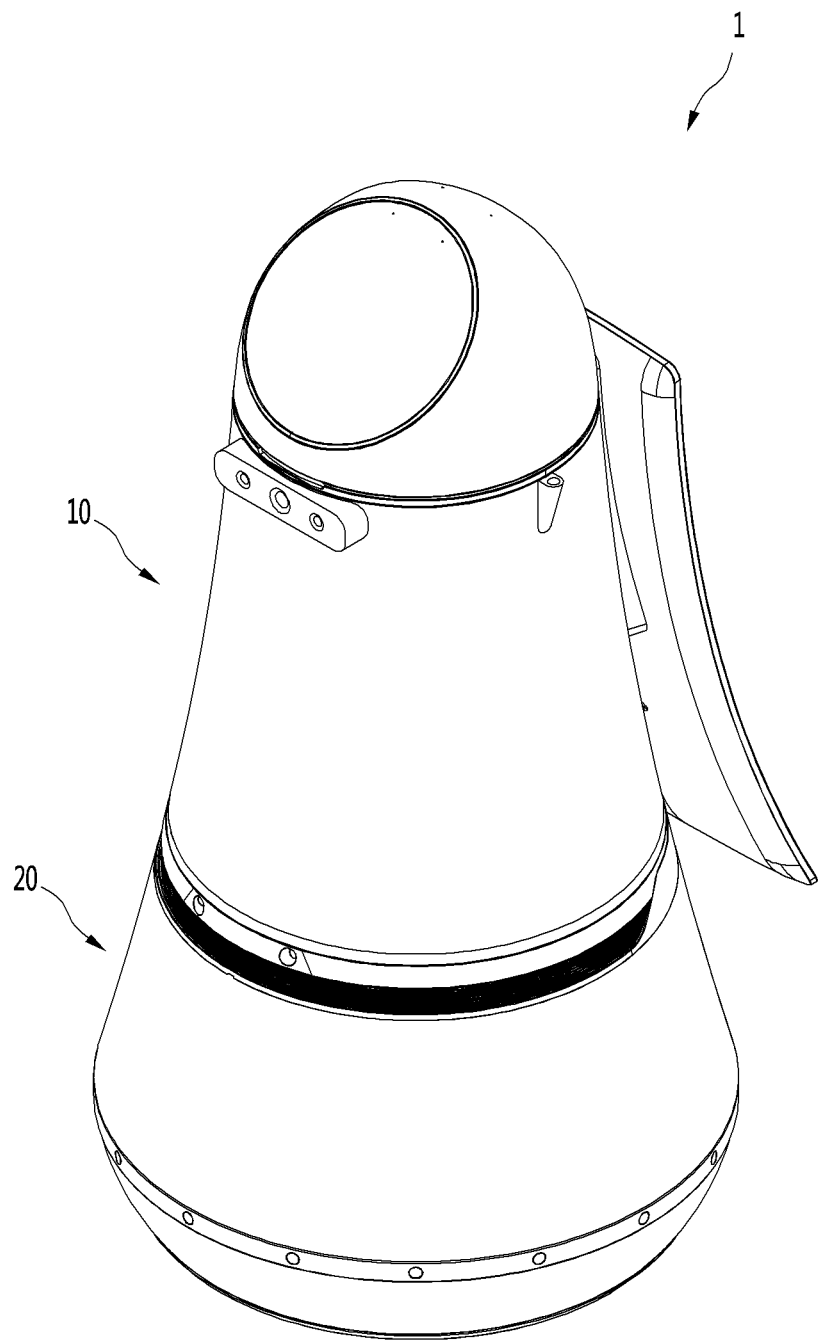

[Fig. 2]
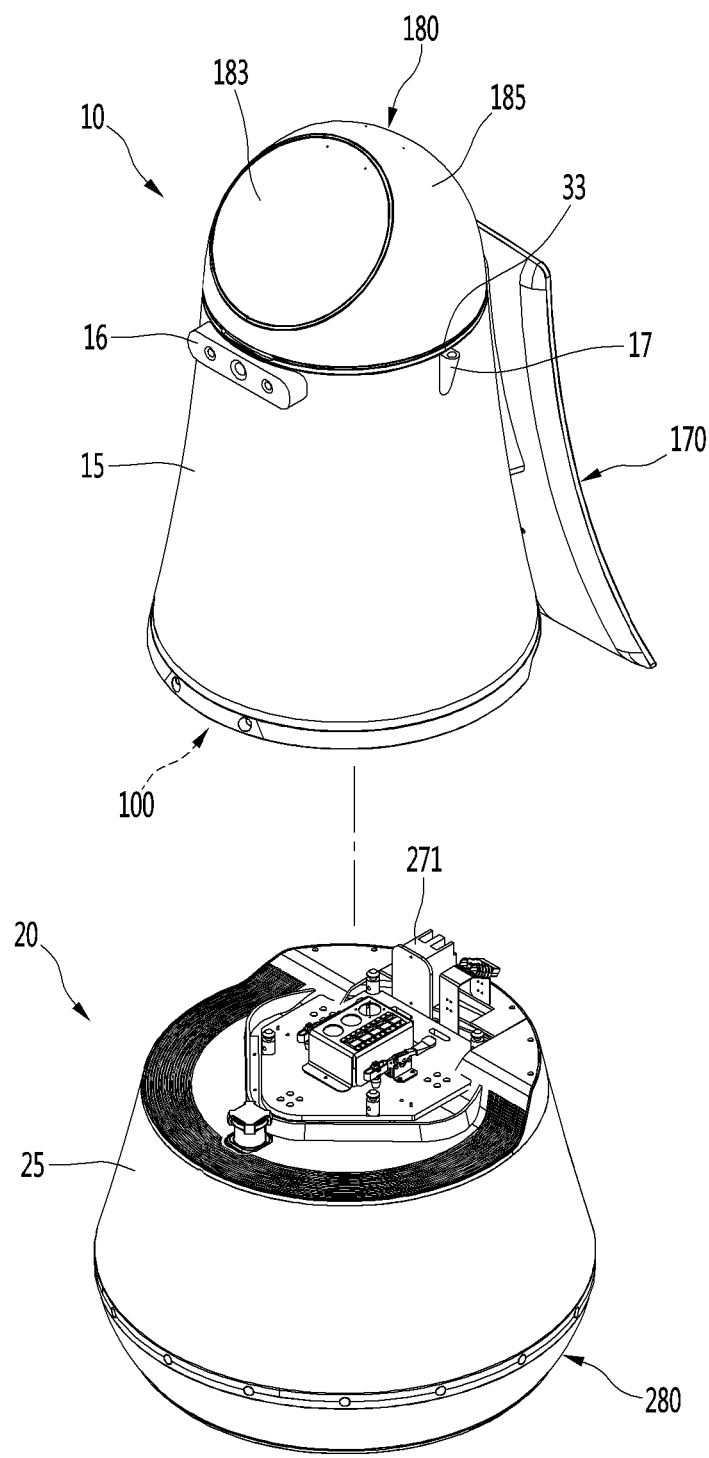

[Fig. 3]
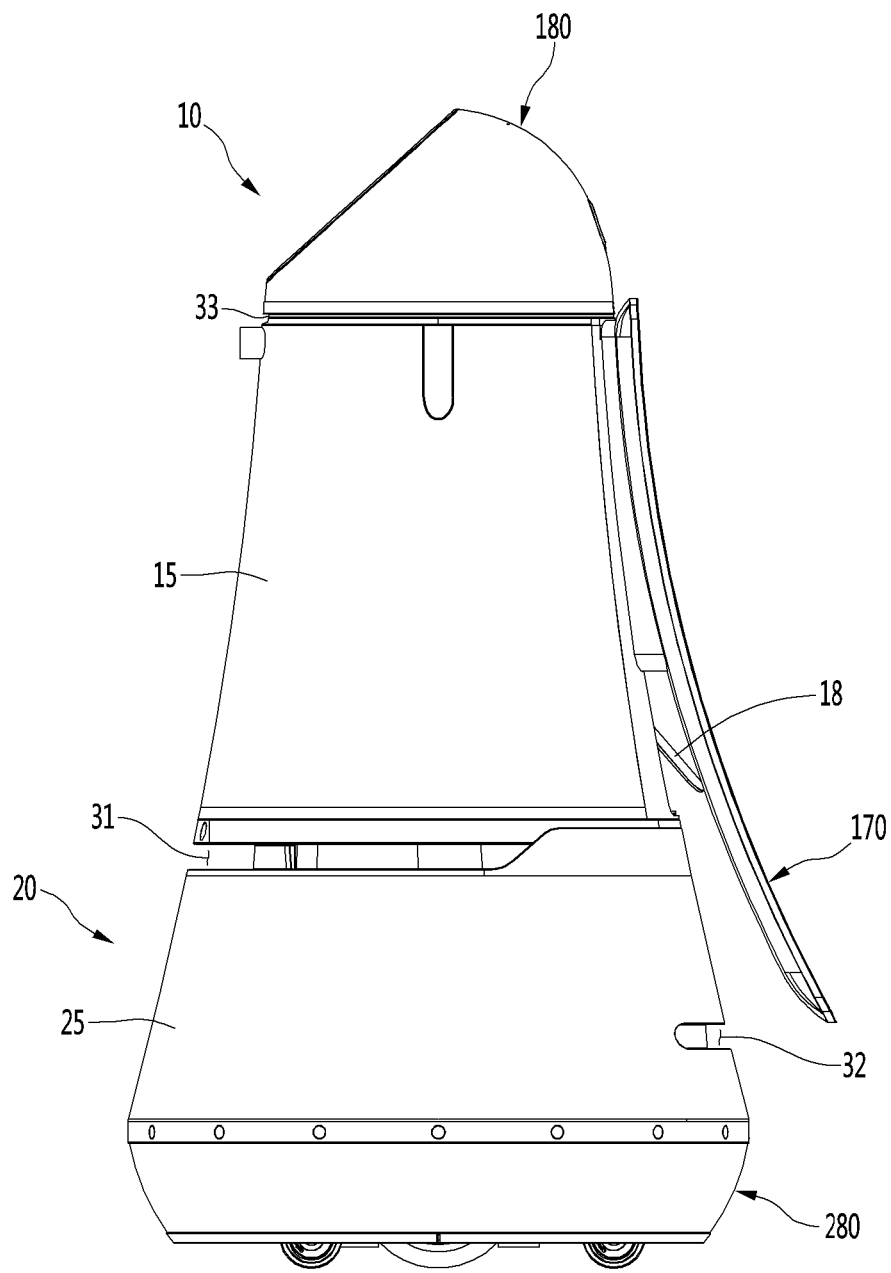

[Fig. 4]
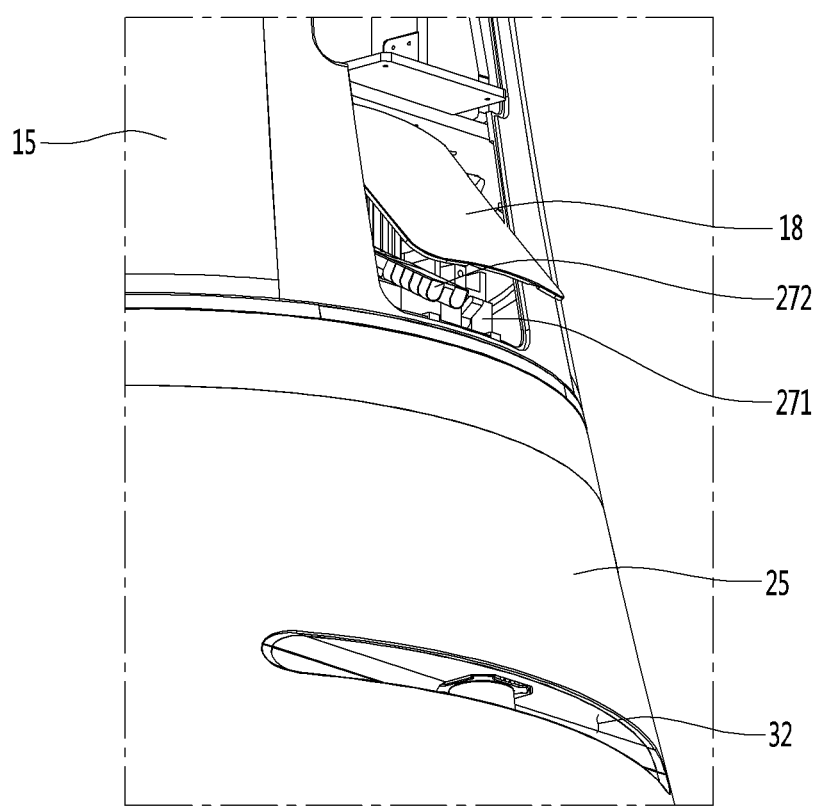

[Fig. 5]
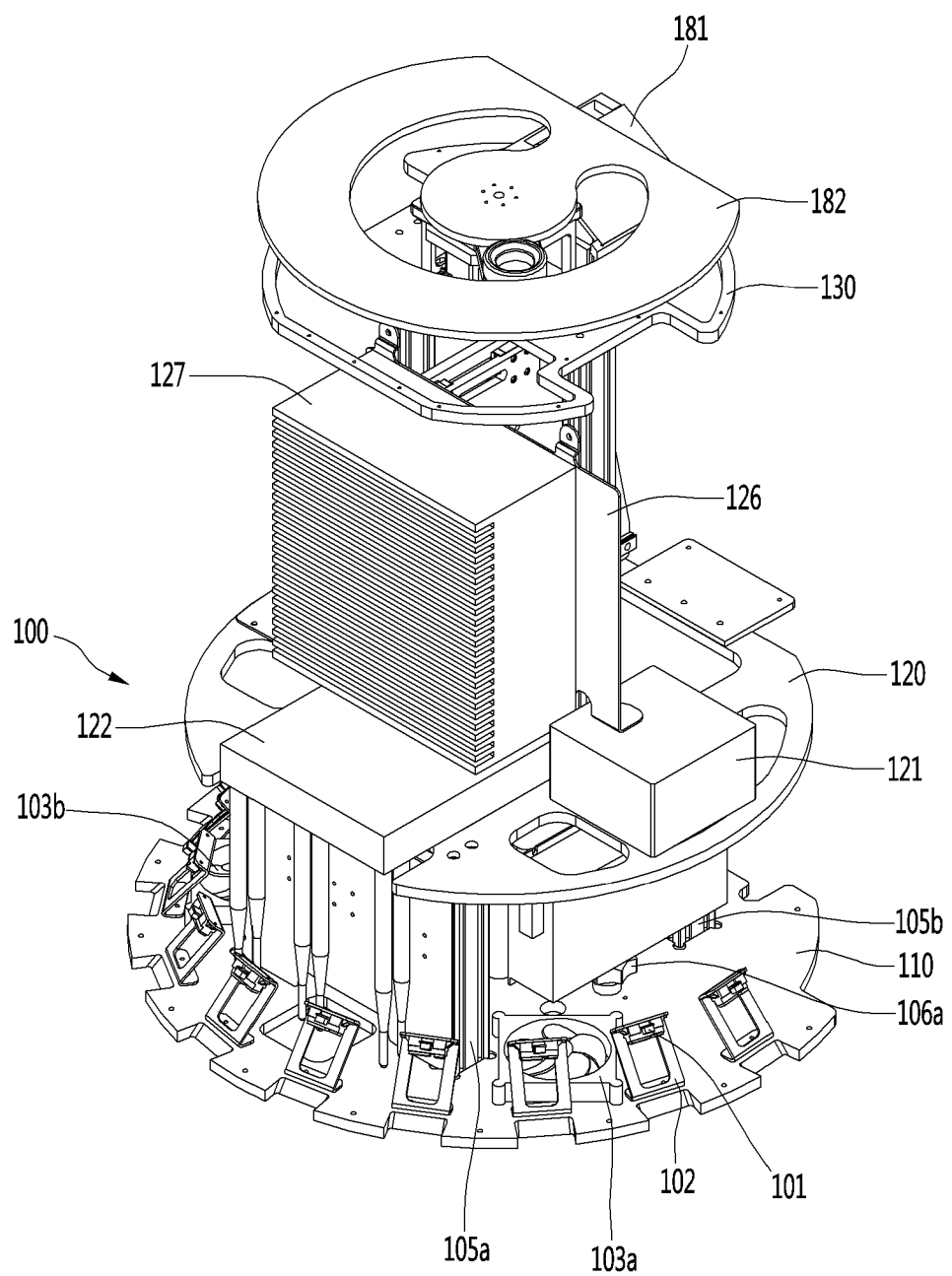

[Fig. 6]
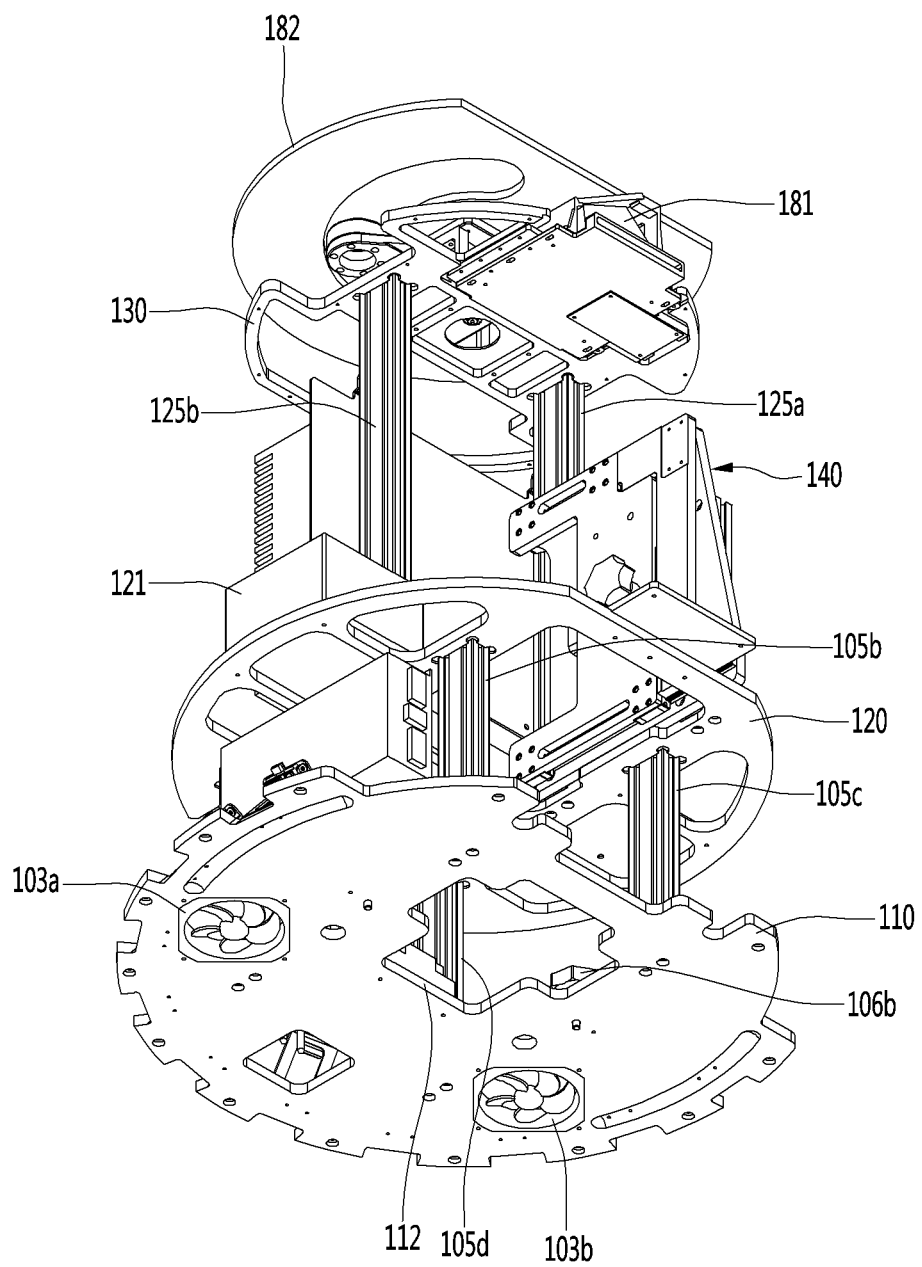

[Fig. 7]
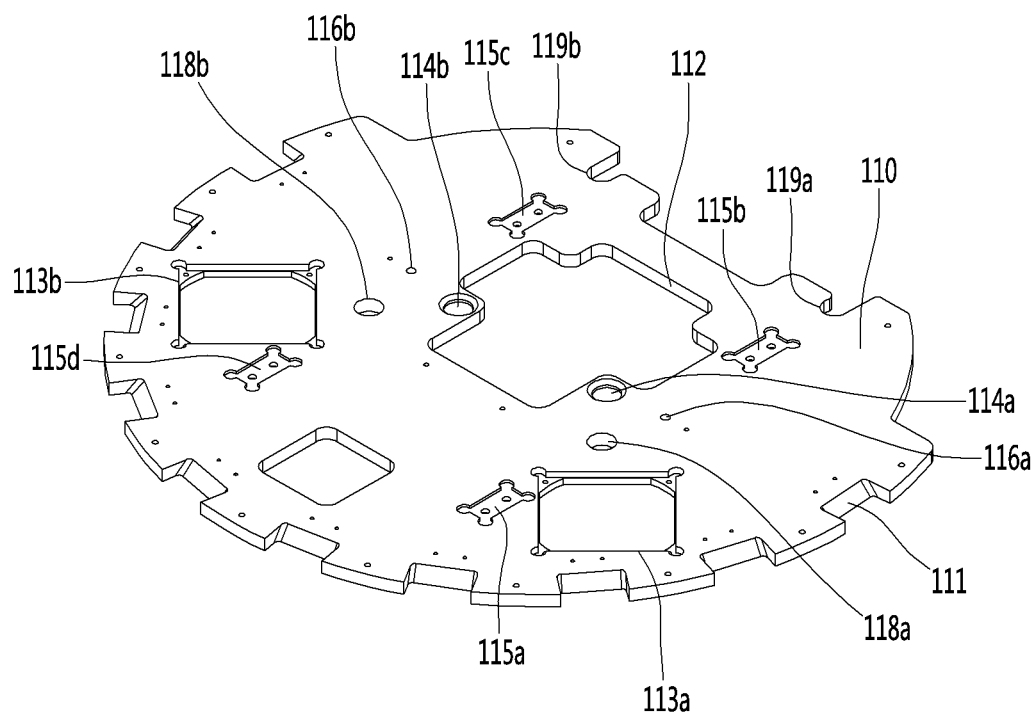

[Fig. 8]
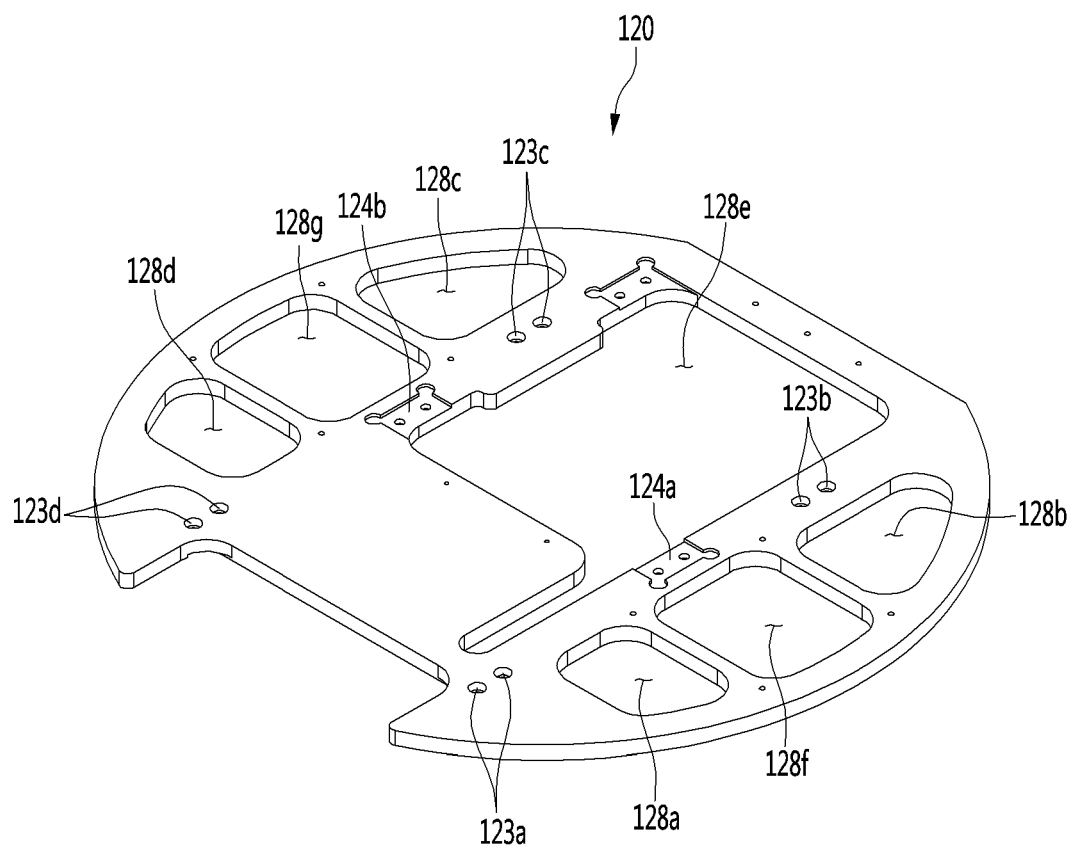

[Fig. 9]
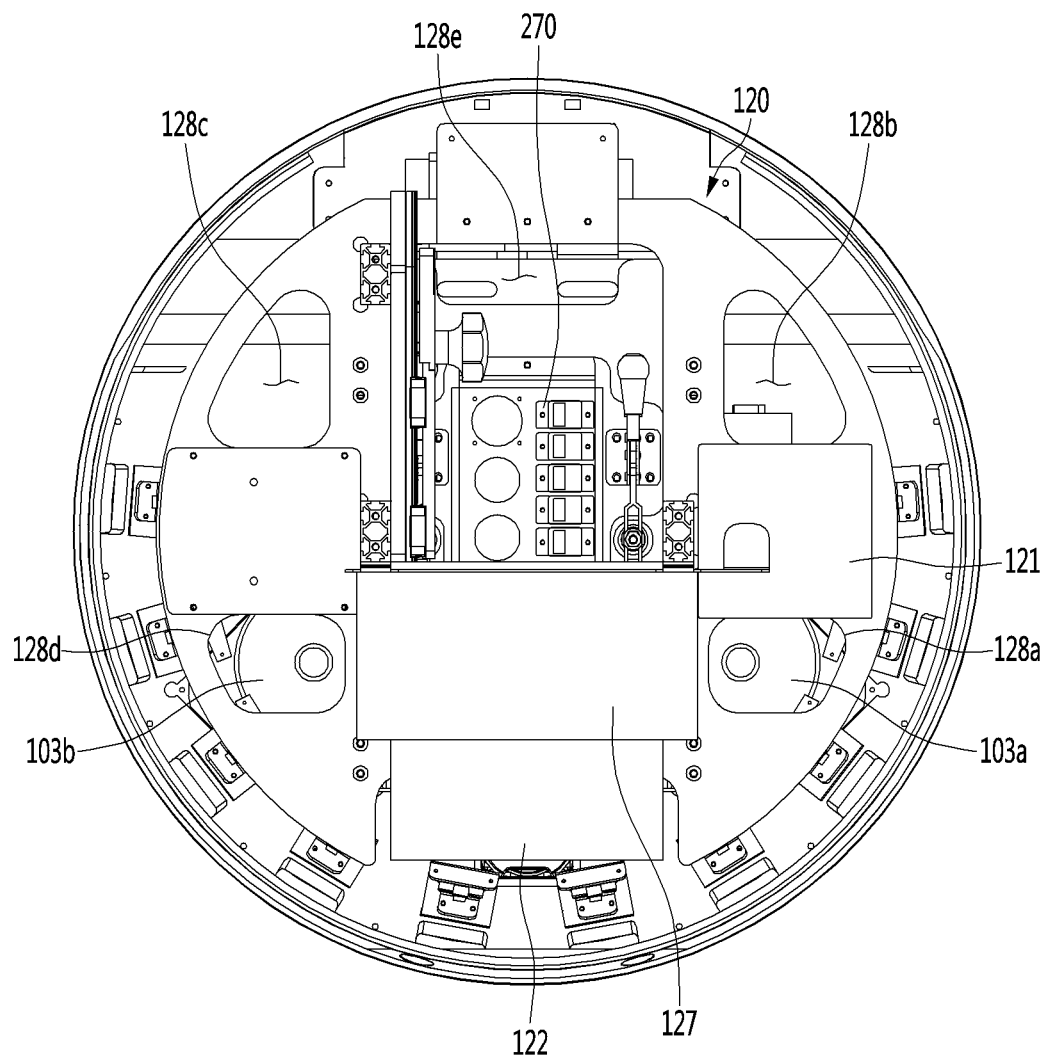

[Fig. 10]
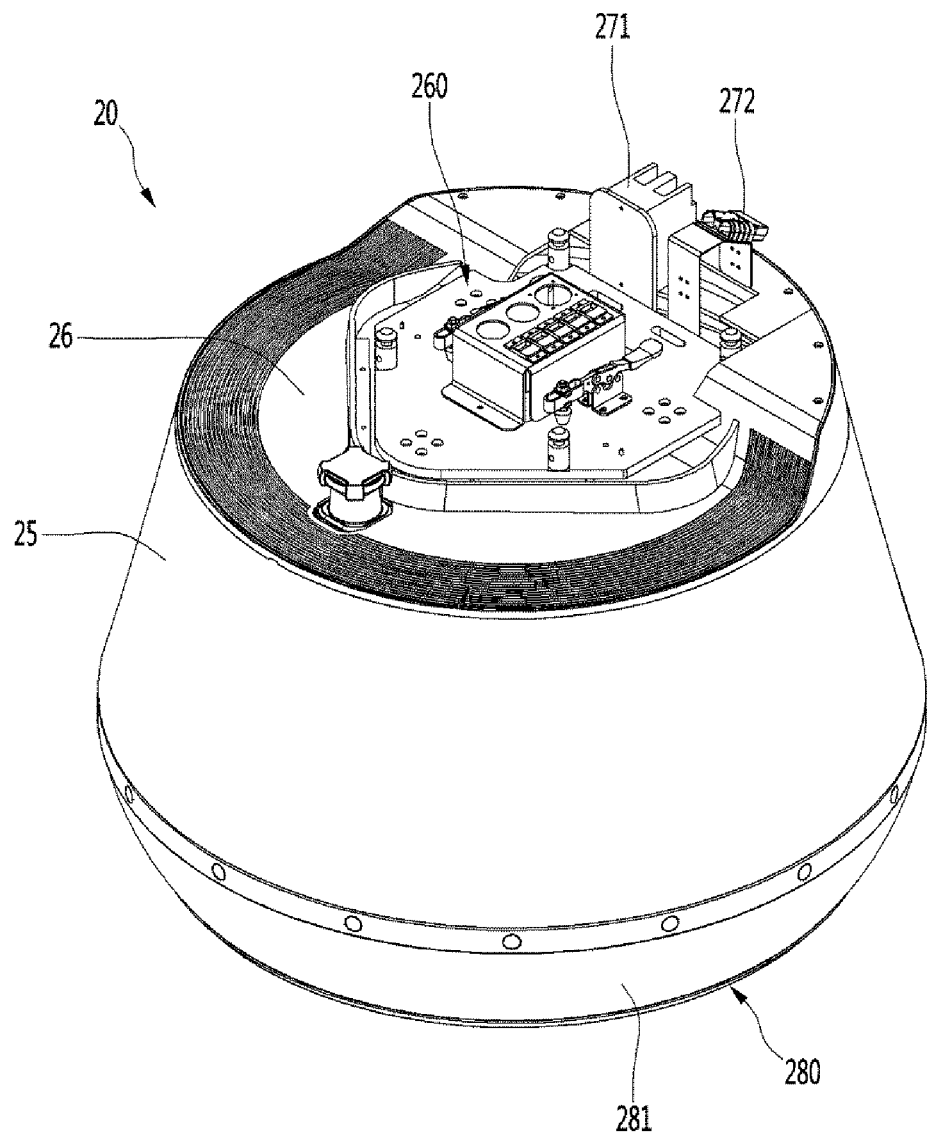

[Fig. 11]
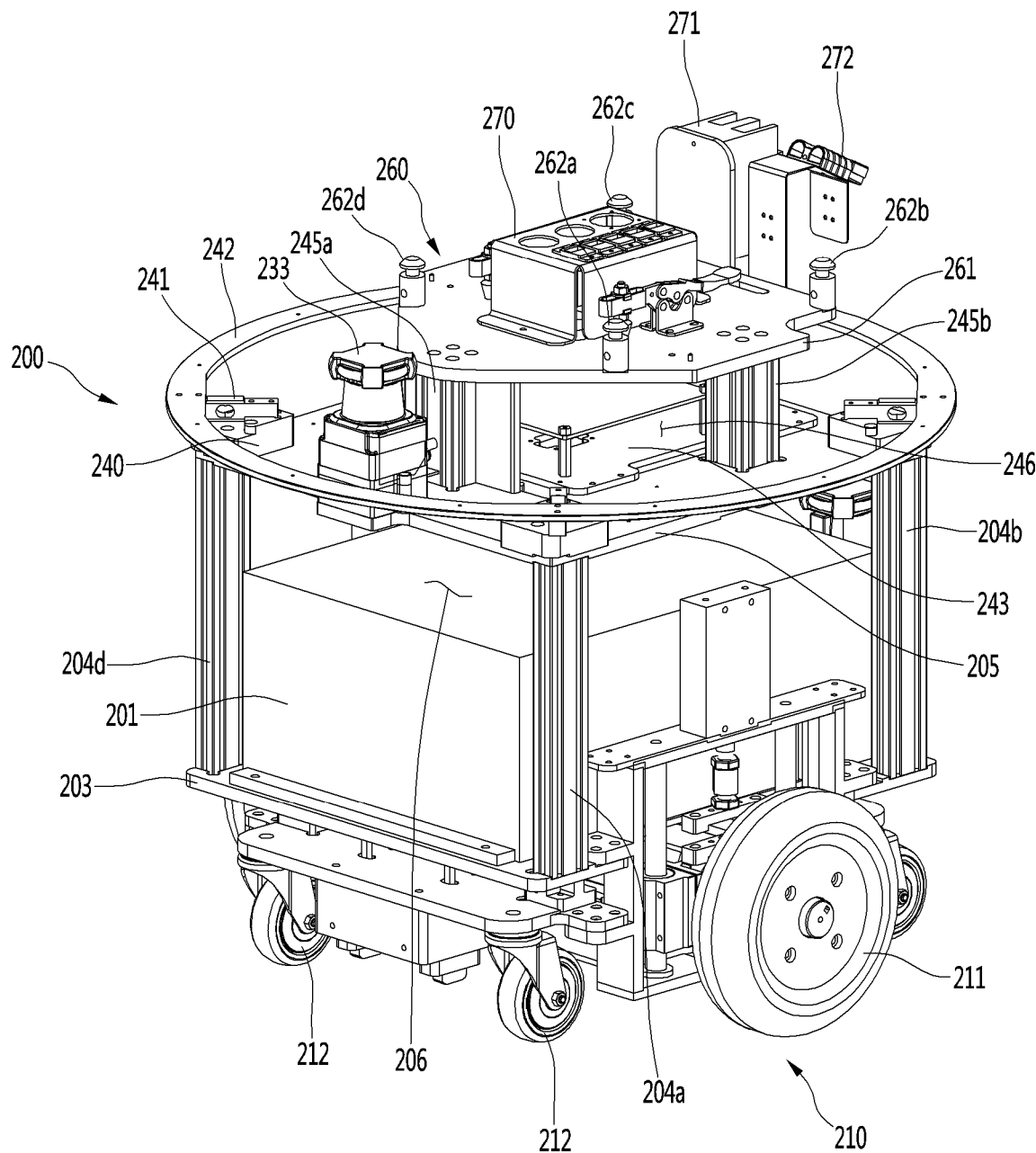

[Fig. 12]
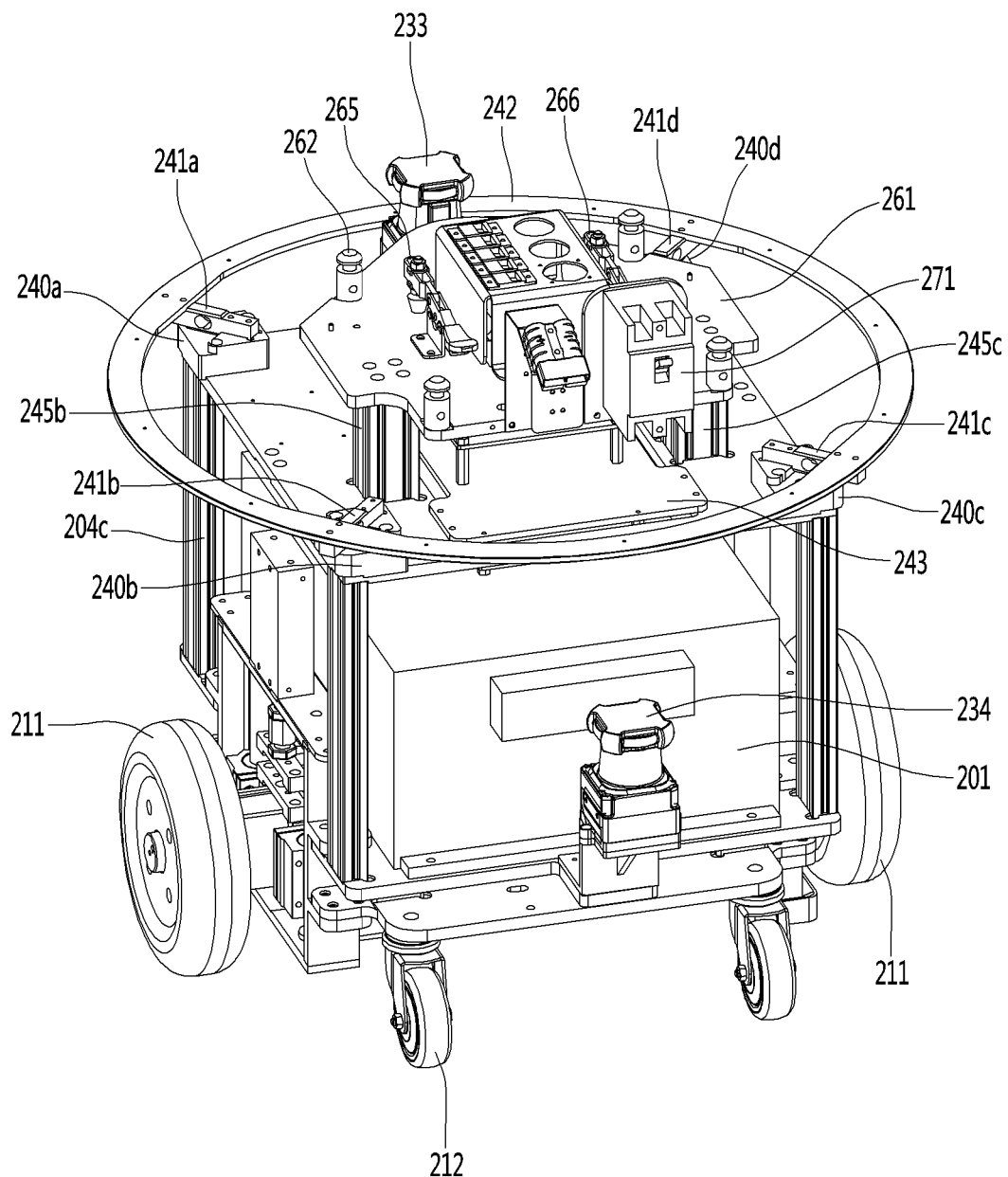

[Fig. 13]
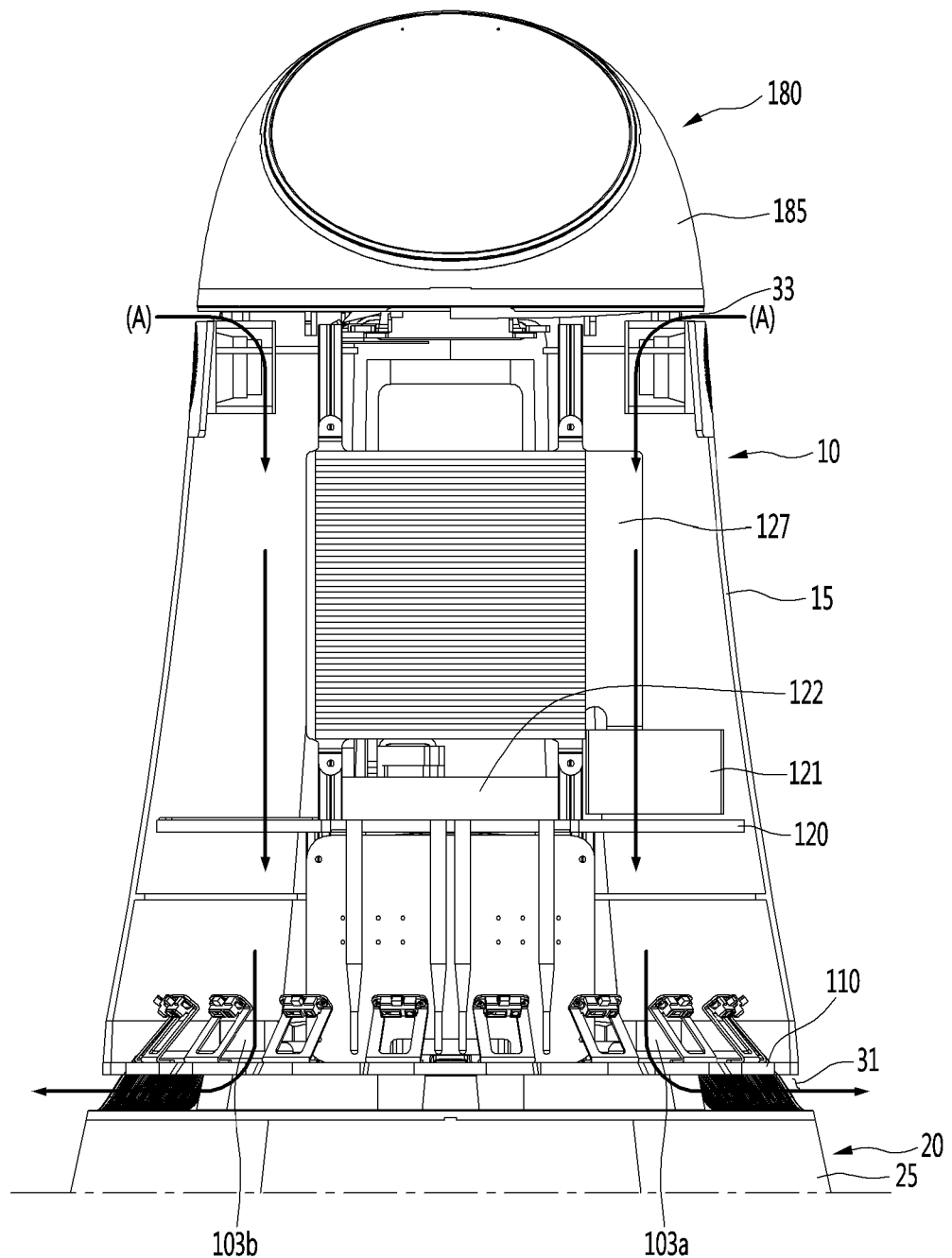

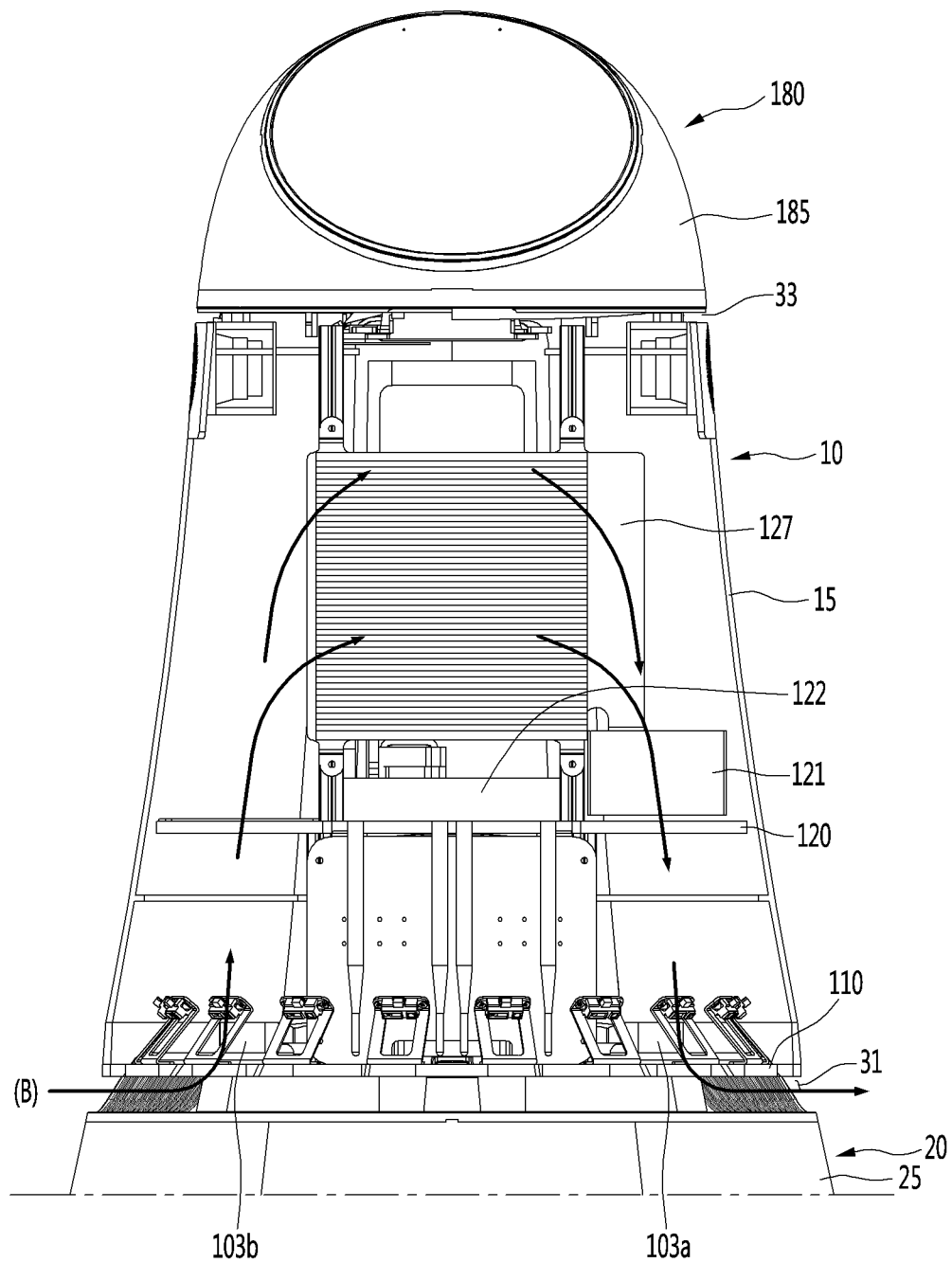
[Fig. 14]

GUIDE ROBOT

CROSS-REFERENCE TO RELATED PATENT APPLICATIONS

This application is a U.S. National Stage Application under 35 U.S.C. § 371 of PCT Application No. PCT/KR2018/007201, filed Jun. 26, 2018, which claims priority to Korean Patent Application No. 10-2017-0085453, filed Jul. 5, 2017, whose entire disclosures are hereby incorporated by reference.

TECHNICAL FIELD

The present disclosure relates to a guidance robot.

BACKGROUND ART

Robot applications are generally classified into industrial, medical, space, and submarine applications. For example, in the machining industry, such as automobile production, robots can perform repetitive works. In other words, many industrial robots which repeat the same movement for hours if works performed by the human arm are taught only once are already in operation.

In addition, a technology that the camera is mounted on the robot has already been implemented a lot in the related art. The robot can check the position or recognize the obstacle using the camera. In addition, a technology that the captured image is displayed on a display unit has been also sufficiently implemented.

In general, it is universal that the services in which the robot is provided vary according to the location, user, purpose, or the like, while the operations performed by the robot for the services provided by the robot can withstand a specified load to move according to the speed, traveling time, and distance of a given specification.

Recently, with the explosive increase of airport users and efforts to leap to the smart airport, a method for providing a service through a robot in the airport has been developed. The introduction of artificial intelligence robots at the airport is expected to contribute to the quantitative and qualitative improvement of the services provided by the robots, which can instead play a unique role of a person that the existing computer system could not replace.

Robots that can provide convenience to users or replace the role of humans are rapidly increasing in demand not only in the airport but also in social facilities such as large shopping facilities, cultural facilities, and public facilities.

Prior Art Republic of Korea Patent Publication No. 10-1193610 (2012 Oct. 26) discloses a traffic guidance intelligent robot capable of autonomous driving. According to the prior document, a robot for avoiding obstacles while traveling autonomously for a traffic guidance instruction in a pedestrian crossing or the like is disclosed.

Meanwhile, as the quality of service required by the user increases day by day, the robot is becoming more modernized and advanced. In addition, in accordance with the trend that the robot is gradually reduced in weight and size, various circuit components such as a computer, a sensor, and a driver for supporting the robot are densely arranged in the robot.

In this case, high-temperature heat may be generated from the electronic components dense in the limited space, and the generated heat needs to be effectively radiated to the outside. In order to increase the heat dissipation efficiency, a heat-dissipating body such as a heat sink has been installed inside or outside the robot in the related art.

However, the structure of installing the heat-dissipating body as described above has a limit to increase the heat dissipation efficiency, there is a problem that the assembling work is cumbersome and separate installation space is required in installing a plurality of heat-dissipating bodies. In addition, since the robot has a structure which an outer appearance of the robot is smoothly connected in consideration of the design elements of the robot, the gap for air circulation in the robot is reduced accordingly, and thus there is a problem that is vulnerable to heat dissipation, as a result.

DISCLOSURE

Technical Problem

An object of the present disclosure is to provide a guidance robot that can effectively cool a plurality of electronic components disposed inside the robot.

Another object of the present disclosure is to provide a guidance robot capable of efficiently cooling a heat source by an air cooling method without providing a separate heat-dissipating body (heat sink).

Still another object of the present disclosure is to provide a guidance robot capable of forming an air circulation flow path therein by minimizing structural changes.

Still another object of the present disclosure is to provide a guidance robot which can selectively set an air circulation flow path by a simple operation.

Still another object of the present disclosure is to provide a guidance robot in which a plurality of electronic components can be efficiently installed in a narrow internal space.

Another object of the present disclosure is to provide a guidance robot that can solve the problem of poor internal accessibility for managing the guidance robot in the related art.

Still another object of the present disclosure is to provide a guidance robot capable of maintaining a design such that an integral aesthetic appearance is transmitted to a user.

Technical Solution

A guidance robot according to an embodiment of the present disclosure includes a display, a head case configured to be provided to be capable of rotating, an upper case configured to couple to the display and the head case, the upper case being configured to receive an electronic component and a cooling fan therein; and a lower case configured to be located on a lower side of the upper case, the lower case being configured to locate a wheel and a motor therein.

When the cooling fan is driven, outside air may be suctioned through a gap between a lower end portion of the head case and an upper-end portion of the upper case, and the suctioned air passes through the electronic component and then may be discharged to the outside through the gap between the lower end portion of the upper case and the upper-end portion of the lower case. Therefore, since the heat source is cooled by the air cooling method by the air flowing in from the outside, the heat source can be effectively cooled without installing a separate heat-dissipating body (heat sink).

In addition, a guidance robot according to an embodiment of the present disclosure further includes a base plate configured to be located inside the upper case, the base plate being configured to dispose the cooling fan thereon; and a middle plate configured to be located above the base plate, the middle plate being configured to dispose the electronic component therein. In addition, an opening through which the air suctioned into the upper case passes is formed in the middle plate. At this time, the opening is located to overlap the cooling fan in a vertical direction, and thus internal air circulation by the cooling fan can be made quickly.

In addition, a guidance robot according to an embodiment of the present disclosure further includes an upper plate configured to be located inside the lower case, the upper plate being configured to dispose a rider for autonomous driving. In addition, the upper portion of the lower case is formed with a cutout to be cut along a circumference of the lower case for the operation of the rider. At this time, the air suctioned through the gap between the lower end portion of the head case and the upper-end portion of the upper case may be discharged to the outside through the cutout after passing through the cooling fan.

In addition, in a guidance robot according to an embodiment of the present disclosure, a pair of cooling fans are provided, and the base plate is disposed to be adjacent to the lower end portion of the upper case. At this time, the pair of cooling fans may have the same rotation direction as each other.

According to another embodiment of the present disclosure, rotation directions of the pair of cooling fans may be directions opposite to each other. At this time, one of the pair of cooling fans guides so as to suction the outside air to the inside of the upper case. The other thereof guide to discharge the air suctioned into the inside of the upper case to the outside. Therefore, the air circulation path can be selectively set by controlling the rotation direction of each cooling fan.

Advantageous Effect

According to the present disclosure, since the heat source is cooled by the air cooling method by the air introduced from the outside, the heat source can be effectively cooled without installing a separate heat-dissipating body (heat sink). Therefore, the fire by the electronic component which generates high-temperature heat is prevented beforehand. In addition, there are effects that the work process for heat dissipation inside the robot is simplified, and the robot unit price is reduced.

According to the present disclosure, since the cooling fan disposed inside the upper case of the guidance robot and the opening formed in the middle plate are located so as to overlap each other, the internal air circulation by the cooling fan can be quickly performed. Therefore, the heat dissipation function can be improved by rapidly cooling the electronic component which generates high-temperature heat.

According to the present disclosure, a flow path in which the air suctioned through the gap between the lower end portion of the head case and the upper-end portion of the upper case of the guidance robot passes through the cooling fan and then is discharged to the outside through the cutout formed in the upper-end portion of the lower case is formed. Therefore, since the outside air flow into and discharged through space (gap) necessary for the operation of the original guidance robot, there is an effect that the suction port and the discharge port for forming a separate air flow path is unnecessary.

According to the present disclosure, since the air circulation flow path can be selectively set only by controlling the rotation direction of the cooling fan, there is an effect of intensive cooling of the area where the electronic components generating high-temperature heat are dense.

DESCRIPTION OF DRAWINGS

FIG. 1 is a perspective view illustrating an outer appearance of a guidance robot according to an embodiment of the present disclosure.

FIG. 2 is a view illustrating a state where the upper module and the lower module of the guidance robot of FIG. 1 are separated.

FIG. 3 is a side view illustrating the guidance robot of FIG. 1.

FIG. 4 is an enlarged view illustrating a portion of the configuration of the guidance robot according to an embodiment of the present disclosure.

FIG. 5 is a perspective view illustrating the inside of the upper module of the guidance robot according to an embodiment of the present disclosure.

FIG. 6 is a perspective view illustrating the inside of the upper module of FIG. 5 viewed from another direction.

FIG. 7 is a view illustrating a base plate of FIG. 5.

FIG. 8 is a view illustrating a middle plate of FIG. 5.

FIG. 9 is a plan view illustrating an inside of an upper module of FIG. 5.

FIG. 10 is a perspective view illustrating a lower module of a guidance robot according to an embodiment of the present disclosure.

FIG. 11 is a perspective view illustrating an inside of a lower module of FIG. 10.

FIG. 12 is a perspective view illustrating the inside of the lower module of FIG. 11 viewed from another direction.

FIG. 13 is a view illustrating the internal air circulation of the upper module according to an embodiment of the present disclosure.

FIG. 14 is a view illustrating the internal air circulation of the upper module according to another embodiment of the present disclosure.

BEST MODE

Hereinafter, some embodiments of the present disclosure will be described in detail with reference to the accompanying drawings. In adding reference numerals to the components of each drawing, it should be noted that the same reference numerals are assigned to the same components as much as possible even though they are illustrated in different drawings. In addition, in describing the embodiments of the present disclosure, when it is determined that a detailed description of a related well-known configuration or function interferes with the understanding of the embodiments of the present disclosure, the detailed description thereof will be omitted.

Hereinafter, a guidance robot according to an embodiment of the present disclosure will be described in detail with reference to the accompanying drawings.

The guidance robot according to the present disclosure may provide various information such as a road guide, a product guide, and airport information to a user who uses a public place such as an airport or a department store. In addition, the guidance robot according to the present disclosure may run in one direction or the other direction according to a predetermined traveling route.

FIG. 1 is a perspective view illustrating an outer appearance of a guidance robot according to an embodiment of the present disclosure, and FIG. 2 is a view illustrating a state where the upper module and the lower module of the guidance robot of FIG. 1 are separated.

Referring to FIGS. 1 and 2, the guidance robot 1 according to the embodiment of the present disclosure may include an upper module 10 and a lower module 20.

The upper module 10 may perform a user interface function. The lower module 20 may perform a traveling function.

The upper module 10 may include a body portion 100, a head portion 180, and a display unit 170 forming a body.

The body portion 100 may include an upper case 15 forming an outer appearance, a first camera 16 installed on one side of the upper case 15, and a second camera 17 installed on the other side of the upper case 15.

The upper case 15 may have a cylindrical shape in which the diameter increases toward the lower side. The first camera 16 may be provided at a front surface of the upper case 15 to face the front. A plurality of second cameras 17 may be provided on the side of the upper case 15.

The first camera 16 may include a 3D stereo camera. The 3D stereo camera may perform functions such as obstacle detection, user face recognition, and stereoscopic image acquisition. Using this, the guidance robot 1 can detect and avoid obstacles according to a movement direction thereof, can grasp the current location, and recognize a user to perform various types of control operations.

The second camera 17 may include a slam (simultaneous localization and mapping) camera. The slam camera performs functions of tracking the location of the camera through feature point matching and creating a 3D map based on the location of the camera. Using this, the guidance robot 1 can determine its current location.

On the other hand, the body portion 100 may further include an RGBD (red, green, blue, distance) sensor (not illustrated) and a speaker (not illustrated) installed on one side of the upper case 15. The RGBD sensor may perform a function of detecting a collision between obstacles and the robot while the guidance robot 1 is traveling. For this purpose, the RGBD sensor may be located to face the front where the guidance robot 1 drives, that is, together with the first camera 16.

The speaker may perform a function of notifying the user of airport-related information by voice. The speaker may be formed on an outer circumferential surface of the upper case 15.

An internal configuration of the body portion 100 will be described later.

The display unit 170 may be located in one direction of the body portion 100. For example, the display unit 170 may be installed at the rear of the guidance robot 1. In addition, the display unit 170 may include a curved display extending in the vertical direction. The display may display a screen for providing visual information.

Referring to FIG. 1, if a direction is defined, a direction in which the first camera 16 is installed is defined as a front direction, and a direction in which the display unit 170 is installed is defined as a rear direction, with respect to the central axis of the guidance robot 1.

The display unit 170 may be coupled to the movement guide unit 140 of the body portion 100 to be described later. The display unit 170 may open or shield the inside of the body portion 100 by the guide of the movement guide unit 140. Of course, the display unit 170 may be fixed by binding to the body portion 100 using a fixing member.

The display unit 170 may be provided for the guidance robot 1 to perform a guide function for the user. Accordingly, the display unit 170 may be located in a direction opposite to the moving direction of the guidance robot 1 to visually provide guide information to a user following through the display unit 170.

In other words, the display unit 170 may perform a function of displaying time information (for example, airport gate query information, road guidance service information, or the like) related to a service currently being provided. For example, the guidance robot 1 may first move along a path set to guide a road to a user. The user can see the display unit 170 installed behind the guidance robot 1 while moving along the guidance robot 1. In other words, even when the guidance robot 1 is traveling for road guidance, the user can easily view the service information displayed on the display unit 170 while following the guidance robot 1.

The head portion 180 may be located above the body portion 100. In detail, the head portion 180 may be connected to an upper-end of the body portion 100 to form an upper portion of the guidance robot 1.

The head portion 180 may include an operation unit 183 that receives a command from a user, and a head case 185 that protects an internal configuration.

The operation unit 183 may include a touch monitor for receiving a touch input from a user. The operation unit 183 may further include an object recognition sensor.

The object recognition sensor may include a 2D camera and an RGBD sensor. The 2D camera may be a sensor for recognizing a person or an object based on a 2D image. In addition, the RGBD sensor may be a sensor for acquiring a position or a face image of a person.

The head case 185 may be spaced apart from the upper case 15 by a predetermined distance. The head case 185 is spaced apart from the upper case 15 to be rotated together by the rotation of the rotating member 182 which will be described later. To this end, the head case 185 is spaced apart from the upper-end of the upper case 15 by a predetermined height, and at this time, an air flow hole 33 having a narrow gap between the head case 185 and the upper case 15.) is formed.

The air flow hole 33 may be understood as a passage for flowing outside air into the guidance robot 1. In other words, the air flow hole 33 may be understood as a component for air-cooling heat generated from a plurality of electronic components disposed inside the guidance robot 1 with outside air.

Meanwhile, the outer appearance of the robot in the related art is generally minimized the gap between each component in consideration of the design element. However, in the present disclosure, in order to rotate the head case 185, the head case 185 should be spaced apart from the upper case 15, and at this time, a gap between the head case 185 and the upper case 15 is used as an air flow hole 33 for the internal air circulation.

The internal air circulation of the guidance robot 1 will be described later.

The head case 185 may be formed such that the upper case 15 extends upward to have a dome shape. In addition, the head case 185 may be configured so as to be capable of rotating 360 degrees.

In addition, the head portion 180 may further include a microphone (not illustrated). The microphone performs a function for receiving a command of an audio signal from a user.

The lower module 20 may include a lower case 25 and an illumination unit 280 forming an out appearance.

The lower case 25 may have a cylindrical shape in which the diameter is increased toward the lower case 25. The illumination unit 280 may be installed below the lower case 25 to be integrated with the lower case 25. In this case, the lower module 20 may have an outer appearance of a jar shape.

The illumination unit 280 may provide various lights provided according to the function of the guidance robot 1.

The lower module 20 may further include an ultrasonic sensor (not illustrated) spaced apart from each other on one side of the lower case 25 is installed. For example, the plurality of ultrasonic sensors may be provided to be spaced apart from each other along a lower circumference of the lower case 25.

The ultrasonic sensor may perform a function of determining a distance between the obstacle and the guidance robot 1 by using an ultrasonic signal. In addition, the ultrasonic sensor may perform a function for detecting an obstacle adjacent to the guidance robot 1.

Since the upper module 10 and the lower module 20 are formed to be structurally independent from each other, the upper module 10 and the lower module 20 can be separated from or coupled to each other. Therefore, the lower end of the upper module 10 and the upper-end of the lower module 20 may be provided with a configuration for hardware and software connection with each other.

For example, the main power switch 271, the input assembly 270, the connection guide 262, and the like, which will be described later, may be located at the lower end of the upper module 10 and the upper-end of the lower module 20.

In other words, since the lower end of the upper module 10 and the upper-end of the upper module 10 are provided with a plurality of components for separating or coupling the guidance robot 1, the module may be separated or combined. There is a need to improve the accessibility of workers, which performs separating or coupling work of the module.

FIG. 3 is a side view illustrating the guidance robot of FIG. 1, and FIG. 4 is an enlarged view illustrating a portion of the configuration of the guidance robot according to an embodiment of the present disclosure. In detail, FIG. 4 is an enlarged view of a portion of a rear portion of the upper module 10 from which the display unit 170 is removed.

Referring to FIGS. 3 and 4, the upper case 10 may include a sub-case 18.

The upper case 15 may have an opening portion in which a portion of the lower end is opened in order to facilitate operator access of the main power switch 271 provided in the lower module 20 and the power plug 272 for charging the battery. The main power switch 271 and the power plug 272 may be located in the opening portion.

In addition, the opening portion may be formed at the rear of the upper case 15 and may be located below the connection opening that is opened and closed depending on whether the display unit 170 is connected. In addition, the opening portion may be formed by extending the connection opening downward.

Here, the connection opening means the opening formed in the upper case 15 so that the operator can easily access the internal configuration of the upper module 10 through the opening and closing or coupling and disassembly of the display unit 170. For example, the worker pulls out the display unit 170 connected to the body portion 100 to the rear by the moving guide unit 140 and can manage the inside configuration of the upper module 10 through the connection opening of the upper case 15.

The sub-case 18 may be rotatably connected to the upper case 15 to open and close the opening portion of the upper case 15. For example, the sub-case 18 may be connected to the upper case 15 by a rotary hinge. The rotary hinges may be provided at the centers of both edges of the sub-case 18 to form a coupling with the upper case 15.

By the rotary hinge, the sub-case 18 may rotate the central portion of both side ends of the upper case 15 forming the opening portion as a support point.

The rotary hinge may be provided with a spring to provide an elastic force. According to this, rotation of the sub-case 18 can be restrained in the range of a predetermined angle, and it can return to an original position after pressurization. For example, the worker may press the upper portion of the sub-case 18 in the inward direction of the upper module 10. The upper-end portion of the sub-case 18 is rotated and moved inwardly of the upper module 10 by the pressure of the worker, and the lower end portion of the sub-case 18 is rotated and moved outward of the upper module 10.

In other words, by moving the lower end portion of the sub-case 18 to the outside, the main power switch 271 or the power plug 272 may be exposed to the outside. In this case, the worker may turn on/off the main power switch 271 or perform a connection of the power plug 272. When the pressurization of the worker is finished, the sub-case 18 may be returned to its original position by the elastic force to shield the opening portion again.

In other words, the connection opening may be opened and closed by the display unit 170, and the opening portion may be opened and closed by the sub-case 18.

Accordingly, there is an advantage that while a worker for performing the connection of the main power switch 271 and the power plug 272 does not need to separate or pull out the display unit 170 from the body portion 100, the worker can open the sub-case 18 and perform the work. In other words, there is an advantage that the access for the job is simple and easy, and the management is convenient. In addition, when the guidance robot 1 operates, the sub-case 18 may be hidden from the user's field of view by the display unit 170 and thus may have an aesthetic effect.

Meanwhile, the lower case 25 may include a first cutout 31 and a second cutout 32.

The first cutout 31 may be formed on the front surface of the lower case 25. The first cutout 31 is a portion cut from the lower case 25 so that the front rider 233 to be described later is operable.

In addition, the first cutout 31 may perform a function as a handle capable of supporting the upper module 10 at a lower end when the upper module 10 and the lower module 20 are coupled or separated.

The front rider 233 is located inside the lower case 25. The first cutout 31 may be formed by cutting along the circumference of the lower case 25 at a point corresponding to the position of the front rider 233. Accordingly, the front rider 233 may be exposed to the outside by the first cutout 31.

The second cutout 32 may be formed on the rear surface of the lower case 25. The second cutout 32 is a portion cut from the lower case 25 to enable the rear rider 234 to be described later to be capable of operating. Specifically, the second cutout 32 may be cut by a predetermined length in the radial direction from the rear surface of the lower case 25. Here, the rear rider 234 is located inside the rear case 25.

The second cutout 32 may be formed by cutting along the circumference of the lower case 25 at a point corresponding to the position of the rear rider 234. Accordingly, the rear rider 234 may be exposed to the outside by the second cutout 32.

The first cutout 31 may be spaced apart in the vertical direction so as not to be connected to the second cutout 32. For example, the first cutout 31 may be located above the second cutout 32.

FIG. 5 is a perspective view illustrating the inside of the upper module of the guidance robot according to an embodiment of the present disclosure, FIG. 6 is a perspective view illustrating the inside of the upper module of FIG. 5 viewed from another direction, FIG. 7 is a view illustrating a base plate of Fig, FIG. 8 is a view illustrating a middle plate of FIG. 5, and FIG. 9 is a plan view illustrating an inside of an upper module of FIG. 5. In detail, FIG. 9 is a plan view illustrating the inside of the upper module 10 from which the top plate 130 is removed.

Referring to FIGS. 5 to 9, the internal configuration of the upper module 10 will be described in detail. First, referring to FIGS. 5 and 6, the body portion 100 may further include a base plate 110 providing a bottom surface of the upper module 10, a middle plate 120 located above the base plate 110, and a top plate 130 located above the middle plate 120. In addition, the body portion 100 may further include a subframe 105 connecting the base plate 110 and the middle plate 120 and a main frame 125 connecting the middle plate 120 and the top plate 130.

In detail, the base plate 110 may provide a base surface of the upper module 10. The base plate 110 may include an insertion hole 112 having an opened central portion thereof. The insertion hole 112 may be formed such that the input assembly 270 of the lower module 20 to be described later is inserted from below. Therefore, the worker can easily connect code for communication, control, or the like between the upper module 10 and the lower module 20 through the input assembly 270 located at a higher position than the base plate 110.

The base plate 110 may be formed in a disk shape. In addition, the base plate 110 may be formed to have a larger outer circumference than the middle plate 120. The middle plate 120 may have a larger outer circumference than the top plate 130. Therefore, when the upper case 15 is coupled to the base plate 110, the middle plate 120, and the top plate 130, the upper case 15 may be provided to have a larger diameter toward the lower side.

The base plate 110 may be seated on the lower module 20 to be coupled or separated. To this end, a configuration for coupling or separating with the lower module 20 may be provided. For example, the body portion 100 may further include a fastening member 106 for fastening the base plate 110 and the lower module 20. The fastening member 106 may couple the base plate 110 and the connection plate 261 of the lower module 20 to be described later. The detailed description thereof will be described later.

The subframe 105 may be located to be perpendicular to the top surface of the base plate 110. In other words, the subframe 105 may be coupled to the top surface of the base plate 110 and may have a shape extending to be long in the upper direction.

A plurality of subframes 105 may be provided. For example, the subframe 105 may include a first subframe 105a, a second subframe 105b, a third subframe 105c, and a fourth subframe 105d.

The first to fourth subframes 105a, 105b, 105c, and 105d may be spaced apart from each other so as to be symmetrical to the top surface of the base plate 110. In addition, the upper side of the first to fourth subframes may be coupled to the middle plate 120 and the lower side thereof may be coupled to the base plate 110. For example, the first subframe 105a and the fourth subframe 105d may be disposed in front of the second subframe 105b and the third subframe 105c.

A lower surface of the middle plate 120 is coupled to an upper-end of the subframe 105, and an upper surface of the middle plate 120 is coupled to the main frame 125. The main frame 120 may be located to be perpendicular to the top surface of the middle plate 120.

A plurality of main frames 125 may be provided. For example, the main frame 125 may be provided as a first main frame 125a and a second main frame 125b. The first main frame 125a and the second main frame 125b may be disposed to be symmetrical with each other by being spaced apart from each other by a predetermined distance.

The PC supporter 126 may be coupled to the front surfaces of the first main frame 125a and the second main frame 125b. The PC supporter 126 performs a function of fixing and supporting the main PC 127 which will be described later.

One side of the first main frame 125a may be provided with a movement guide unit 140 coupled to the display unit 170 to guide the front and rear sliding movement of the display unit 170.

The movement guide unit 140 may include a support plate coupled to the first main frame 125a and a movement plate connected to the support plate so as to slide in the front and rear direction. In addition, the display unit 170 may be coupled to the moving plate to perform the sliding movement in the front and rear direction.

As described above, in order to repair and replace the internal configuration of the upper module 10, the worker pulls the display unit 170 to the rear to open the above-described connection opening, and repair and replacement work can be performed through the connection opening.

The top plate 130 may be coupled to an upper-end of the main frame 125.

The body portion 100 may further include a cliff detection sensor 101 which may be linked with the lower module 20 to supplement the traveling function of the guidance robot 1.

The cliff detection sensor 101 may perform a function of detecting a step of a traveling surface on which the guidance robot 1 moves. In conjunction with this, the guidance robot 1 may perform a stop or avoid driving when sensing a cliff or an obstacle while driving.

The body portion 100 may further include a main PC 127 configured to perform a UI function according to various service environments.

The main PC 127 may be located above the middle plate 120. The main PC 127 may be fixedly supported by being coupled to the PC supporter 126. In other words, the main PC 127 may be located in the front surface of the PC supporter 126.

The main PC 127 may be set according to various service environments provided by the guidance robot 1. In other words, the main PC 127 may be programmed to provide a service of the guidance robot 1 adapted to each service environment by changing its setting according to the service environment. In addition, through the continuous upgrade of the main PC 127, it is possible to develop the operating environment and service provision of the guidance robot 1.

On the other hand, the heat emitted from the main PC 127 may be discharged to the outside by the first cooling fan 103a and the second cooling fan 103b provided in the base plate 110. In other words, the first cooling fan 103a and the second cooling fan 103b may perform a heat dissipation function of the upper module 10.

In addition, the body portion 100 may further include various boards for controlling the operation of the guidance robot 1. The body portion 100 may further include a main board 121, a user interface board, and a stereo board.

The main board 121 may be located above the middle plate 120. The main board 121 may be connected to the main PC 127 to perform functions of stably driving the main PC 127 and exchanging data input/output between various control devices.

The user interface board may control the operation of a component in charge of input and output of a user.

The stereo board may be in charge of data management for location recognition and obstacle recognition of the guidance robot 1 by handling and processing sensing data collected from various sensors and cameras.

The body portion 110 may further include a communication device 122 capable of performing communication between the upper module 10 and an external device or the upper module 10 and the lower module 20. The communication device 122 may be located above the middle plate 120. The communication device 122 may include an IP router.

Meanwhile, the head portion 180 may further include a reader 181. The reader 181 may be located above the top plate 130.

The reader 181 may scan or recognize a passport, a ticket, a mobile barcode, or the like of the user. Therefore, based on the information acquired through the reader 181, information necessary for the user may be displayed through the display unit 170. For example, when the user inserts the mobile device into the reader 181 to recognize the barcode of the mobile boarding pass, the display unit 170 can display and guide a boarding gate to which the user should move based on the information acquired through the mobile boarding pass.

In addition, the head portion 180 may further include a rotating member 182 and a rotating motor. The rotary motor may be located at the central portion of the top plate 130. The rotating member 182 may be connected to the rotary motor upwardly.

The head case 185 may be coupled to an edge of the rotating member 182. Therefore, the head case 185 may be rotated together by the rotation of the rotating member 182. The rotating motor may provide power for rotating the rotating member 182.

Meanwhile, the base plate 110 fixes and supports the configuration of the upper module 10 to the lowermost end thereof, is seated on the lower module 20, and stably couples or separates the upper module 10 and the lower module 20. The base plate 110 will be described in detail with reference to FIG. 7.

Referring to FIG. 7, the base plate 110 may have a disk shape. In addition, the base plate 110 may form a plurality of cliff grooves 111 spaced apart from each other by a predetermined distance along the front semicircle circumference.

Since the cliff detection sensor 101 needs to detect a traveling floor on which the guidance robot 101 runs, the cliff detection sensor may be disposed so that a direction in which the detection signal is transmitted may be disposed inclined downward. Therefore, the detection signal of the cliff detection sensor 101 installed along the circumference of the uppermost front surface of the upper surface of the base plate 110 may cause an interference problem due to reflection of the base plate 110. Therefore, the cliff groove 101 may be formed in the base plate 110 according to the present disclosure to avoid interference of the detection signal.

In detail, the cliff groove 111 may be formed as a groove inclined outward in a downward direction corresponding to the position where the cliff detection sensor 101 is installed.

In addition, as described above, the insertion hole 112 is formed at the central portion of the base plate 110 so that the input assembly 270 of the lower module 20 to be described later may be inserted thereinto and passed therethrough.

The first cooling fan mounting hole 113a and a second cooling fan mounting hole 113b in which the first cooling fan 103a and the second cooling fan 103b are installed at one side front and the other front of the base plate 110, respectively, around the insertion hole 112 may be formed. In addition, the base plate 110 may be formed with a subframe coupling groove 115 to guide and fasten the coupling of the subframe 105.

The subframe coupling groove 115 includes first to fourth subframe coupling grooves 115a, 115b, 115c, and 115d. The first to fourth subframe coupling grooves 115a, 115b, 115c, and 115d are formed on the upper surface of the base plate 110 corresponding to the lower end portions of the first to fourth subframes 105a, 105b, 105c, and 105d, respectively.

In addition, the base plate 110 may further include the first pressing groove 114a and the second pressing groove 114b provided to firmly press the upper surface of the base plate 110 in contact with the pressure link 265 and 266 of the lower module 20 to be described later.

The first pressing groove 114a and the second pressing groove 114b may be located to form symmetry with each other and may be formed as grooves which are dug downward in the upper surface of the base plate 110.

In addition, the base plate 110 may further include a first guide hole 118a and a second guide hole 118b into which the connection guide 262 of the lower module 20 to be described below is inserted from below and fixed. In addition, the base plate 110 may further include a first guide groove 119a and a second guide groove 119b for contacting and supporting the connection guide 262 of the lower module 20 to be described later from the rear.

In detail, the first guide hole 118a and the second guide hole 118b are located to be symmetrical with each other and may be formed as holes having the same shape. In addition, the first guide hole 118a and the second guide hole 118b may be understood as a point through which the first connection guide 262a and the fourth connection guide 262d to be described later are inserted. According to this, the upper module 10 has an advantage that can be securely seated on the lower module 20.

In addition, the first guide groove 119a and the second guide groove 119b are spaced apart from the rear of the first guide hole 118a and the second guide hole 118b, respectively, and are provided to be symmetrical with each other. The first guide groove 119a and the second guide groove 119b may be formed as grooves recessed forward from the rear end portion of the base plate 110 to open the rear.

The second connection guide 262b and the third connection guide 262c which will be described later are inserted into and fixed to the first guide groove 119a and the second guide groove 119b from the rear, respectively, so that the upper module 10 may be stably guided to form a coupling with the lower module 20.

In addition, the base plate 110 may include a fastening hole 116 into which the fastening member 106 for fastening with the lower module 20 is inserted. The fastening hole 116 may be located to be symmetrical with respect to the insertion hole 112. The fastening holes 116 may be provided in a number corresponding to the fastening member 106.

For example, the fastening hole 116 may include a first fastening hole 116a and a second fastening hole 116b, and the fastening member 106 may include a first fastening member 106a and a second fastening member 106b. The first fastening hole 116a may be fastened to the lower module 20 by inserting the first fastening member 106a thereinto, and the second fastening hole 116b may be fastened to the lower module 20 by inserting the second fastening member 106b thereinto.

Meanwhile, the middle plate 120 is located above the base plate 110 and serves to fix and support the top plate 130. In addition, the middle plate 120 is located at a height corresponding to the height between the base plate 110 and the top plate 130, thereby maintaining the outer appearance of the upper case 15.

The outer circumferential surface of the middle plate 120 may contact or be coupled to a portion of the inner circumferential surface of the upper case 150. Therefore, when an external force is applied from the outside of the upper case 15, a phenomenon can be prevented that a portion of the upper case 15 is crushed or recessed inward by the support of the middle plate 120. The middle plate 120 will be described in detail with reference to FIG. 8.

Referring to FIG. 8, the middle plate 120 may have a disk shape. The middle plate 120 may have a larger outer circumference than the base plate 110 and may have a smaller outer circumference than the top plate 130.

The middle plate 120 provides a surface on which a plurality of electronic components including the main board 121 and the communication device 122 described above are seated. In other words, the communication device 122 may be disposed in front of the middle plate 120, and the main board 121 may be disposed at the side of the middle plate 120.

The middle plate 120 may be provided with a subframe coupling hole 123 that guides and fastens the coupling of the subframe 105.

The subframe coupling holes 123 include first to fourth subframe coupling holes 123a, 123b, 123c, and 123d. The first to fourth subframe coupling holes 123a, 123b, 123c, and 123d may be formed through the point of the middle plate 120 corresponding to each of upper-end portions of the first to fourth subframes 105a, 105b, 105c, and 105d.

In addition, the middle plate 120 may further include a main frame coupling groove 124 that guides the coupling of the main frame 125 and is fastened to the main frame 125.

The main frame coupling groove 124 includes a first main frame coupling groove 124a and a second main frame coupling groove 124b. The first main frame coupling groove 124a and the second main frame coupling groove 124b may be formed on the upper surface of the middle plate 120 corresponding to each of the lower end portions of the first main frame 125a and the second main frame 125b.

In addition, a plurality of openings 128 are further formed in the middle plate 120. The plurality of openings 128 serves to reduce the weight of the middle plate 120, and a portion of the openings 128 serves to form a flow path of air for cooling the electronic components included in the guidance robot 1.

In detail, the plurality of openings 128 may include first to fourth openings 128a, 128b, 128c, and 128d through which air passes.

The first opening 128a and the fourth opening 128d are located to be symmetrical with each other and may have the same shape. In addition, the second opening 128b and the third opening 128c are similarly located to be symmetrical with each other and may have the same shape. At this time, the second opening 128b and the third opening 128c may be spaced apart from the rear of the first opening 128a and the fourth opening 128d, respectively. For example, the first to fourth openings 128a, 128b, 128c, and 128d may be spaced apart from each other at a portion adjacent to the edge of the middle plate 120.

In the present disclosure, the air flowing into the interior from the outside of the guidance robot 1 may flow through some or all of the first to fourth openings 128a, 128b, 128c, and 128d. At this time, the internal air of the guidance robot 1 is forcedly circulated by the first cooling fan 103a and the second cooling fan 103b, and exchanges heat with the electronic components disposed in the guidance robot 1. The heat-exchanged air repeats a series of circulation processes discharged to the outside of the guidance robot 1 by the first cooling fan 103a and the second cooling fan 103b.

In other words, the air flowing through the air flow hole 33 located at the upper-end of the upper case 15 is moved downward by the first cooling fan 103a and the second cooling fan 103b, and the air moved downwards may be discharged to the outside through the opened lower end of the upper case 15.

As illustrated in FIG. 9, some of the first to fourth openings 128a, 128b, 128c, and 128d may overlap the first cooling fan 103a or/and the second cooling fan 103b.

For example, the first opening 128a and the fourth opening 128d may be disposed to overlap the first cooling fan 103a and the second cooling fan 103b in the height direction, respectively. In another aspect, the first opening 128a and the fourth opening 128d may be disposed to face the first cooling fan 103a and the second cooling fan 103b in the vertical direction, respectively.

According to the configuration of the present disclosure, since the air flowing through the air flow hole 33 is rapidly circulated inside the upper module 10 by the first cooling fan 103a and the second cooling fan 103b, the heat dissipation function of the electronic component may be further improved.

In addition, the plurality of openings 128 may further include a fifth opening 128e through which air passes.

The fifth opening 128e may be formed at the rear side of the middle plate 120. In addition, the fifth opening 128e may be disposed to overlap the input assembly 270 in the height direction. In another aspect, the fifth opening 128e may be disposed to face the input assembly 270 in the vertical direction.

Therefore, the air flowing through the air flow hole 33 can be quickly moved to the input assembly 270 through the fifth opening 128e, thereby effectively cooling the heat emitted from the input assembly 270.

In addition, the plurality of openings 128 may further include a sixth opening 128f and a seventh opening 128g. The sixth opening 128f and the seventh opening 128g may not be utilized as passages through which air flows and may be shielded by placing various electronic components (for example, main board 121).

Hereinafter, the lower module 20 will be described in detail with reference to the drawings.

FIG. 10 is a perspective view illustrating a lower module of a guidance robot according to an embodiment of the present disclosure, FIG. 11 is a perspective view illustrating an inside of a lower module of FIG. 10, and FIG. 12 is a perspective view illustrating the inside of the lower module of FIG. 11 viewed from another direction.

Referring to FIGS. 10 to 12, the lower module 20 may further include a driving unit 200, a traveling unit 210, and a connection portion 260. The lower module 20 may further include a shielding case 26 forming an upper portion of an outer appearance and shielding an open space between the upper-end of the lower case 25 and the connection portion 260.

As described above, the upper module 10 performs a user interface (UI) function that can be changed according to various service environments of the guidance robot 1, and the lower module 20 performs a traveling function with little change possibility even in various service environments.

For the traveling function, which is a common function of the guidance robot 1, the lower module 20 may include a traveling unit 210 having wheels, motors, and the like, a driving unit 200 including a battery capable of providing power to the traveling unit 210, or the like, and a connection portion 260 for forming a stable and rigid coupling with the upper module 10.

Of course, the function that the guidance robot can be used in common in various service environments is not limited to the traveling function as the embodiment of the present disclosure. However, in the embodiment of the present disclosure, the common function of the guidance robot 1 will be described in detail in terms of traveling.

The driving unit 200 may include a low plate 203 forming a base surface of the lower module 20, a battery 201 seated on the low plate 203, an upper plate 205 located above the battery 201 and a lower frame 204 connecting the low plate 203 and the upper plate 205 to each other.

The low plate 203 may form a bottom surface of the lower module 20. The low plate 203 may be connected to the traveling unit 210. The shape of the low plate 203 may vary. For example, the low plate 203 may be formed in a rectangular plate.

The lower frame 204 may be provided to extend upwardly at the end portion of the low plate 203. For example, a plurality of lower frames 204 may be provided at positions corresponding to vertices of the low plate 203.

The lower frame 204 may include a first lower frame 204a, a second lower frame 204b, a third lower frame 204c, and a fourth lower frame 204d. The first to fourth lower frames 204 may be provided at respective end portions at which four vertices of the low plate 203 having a rectangular shape are located. Accordingly, the upper plates 205 connected to the upper side of the first to fourth lower frames 204 may be stably supported.

The lower frame 204 may be vertically connected to the low plate 203 and the upper plate 206. In detail, the lower frame 204 may be coupled to an upper surface of the low plate 203 and a lower surface of the upper plate 205. In addition, the lower frame 204 may have a hexahedral pillar shape extending in one direction.

A central portion of the upper plate 205 may form a hole. The hole of the upper plate 205 is provided with the electric plate 243 to be described later and thus a plurality of electronic components may be installed.

The upper plate 205 may have various shapes. For example, the upper plate 205 may be formed of a square plate. At this time, the size of the upper plate 205 may be formed to be the same as the size of the low plate 203. Therefore, the position where the lower frame 204 and the low plate 203 are coupled to each other may correspond to the position where the lower frame 204 and the upper plate 205 are coupled to each other. However, the size of the upper plate 205 is not limited to the size of the row plate 203.

A lower surface of the upper plate 205 may be connected to the lower frame 204, and an upper surface of the upper plate 205 may be connected to an upper frame 245 which will be described later.

The low plate 203, the lower frame 204, and the upper plate 205 may have a rectangular parallelepiped shape with a hollow. The inner space between the low plate 203 and the upper plate 205 is referred to as an installation space 206. The installation space 206 may be understood as a space in which the battery 201 having a relatively heavy weight is located.

The battery 201 may include a lithium-ion battery. However, the present disclosure is not limited thereto, and the battery 201 may include other types of batteries other than lithium-ion batteries.

The battery 201 may supply power for driving the guidance robot 1. The battery 201 may be located in the installation space 206. Since the battery 201 occupies the largest specific gravity of the total weight of the guidance robot 1, it is preferable to be seated on the top surface of the low plate 203 in terms of the center of gravity.

The driving unit 200 may further include an upper frame 245 supporting the connection portion 260 and an electric field plate 243 located at the central portion of the upper plate 205.

The electrical plate 243 may be located at the central portion of the upper plate 205. A plurality of electrical plates 243 may be provided so as to form a plurality of layers in the vertical direction. The plurality of electrical plate 243 is disposed in the vertical direction to form a plurality of layers, and the plurality of layers is referred to as the electric field space 246.

A plurality of electronic components may be located in the electric field space 246. The plurality of electronic components may be coupled to the electric plate 243. For example, the electric field space 246 may be provided with a plurality of boards.

The plurality of boards may include an AP board (Application Processor), an MCU board (Micro Controller Unit), a power board, a PCB board, and the like.

The AP board may function as a device for managing a hardware module system of the guidance robot 1, that is, a controller.

The MCU board may control the overall driving of the guidance robot 1 and may include a memory in which data for supporting various functions of the guidance robot 1 is stored.

The power board may control that power of the battery 201 is supplied to each component included in the guidance robot 1.

The upper frame 245 may be connected to the upper plate 205. The upper frame 245 may be located between the outer circumference of the upper plate 205 and the inner circumference formed by the central hole. In more detail, the upper frame 245 may be located on the upper surface of the upper plate 205 such that a virtual triangle is drawn to the outside of the electric field plate 243. The upper frame 235 may be located at each of the virtual triangle vertices.

In other words, a plurality of upper frames 245 may be provided to support three points of the connection portion 260. For example, the upper frame 245 may include a first upper frame 245a located in front of the electric plate 243, a second upper frame 245b located at both sides of the electric plate 243, and a first upper frame 245a. The connection plate 261 of the connection portion 260 may be coupled to an upper side of the first to third upper frames 245.

The upper frame 245 may be vertically coupled to an upper surface of the upper plate 205. The upper frame 245 may have a hexahedral pillar shape extending in one direction. In addition, since the length of the upper frame 245 in the vertical direction is fixed to support the connecting portion 260 for coupling or separation with the upper module 10, when the upper module 10 and the lower module 20 is coupled, in order to achieve a stable balance, it may be formed smaller than the length of the lower frame 204 in the vertical direction.

On the other hand, the connection portion 260 will be described in detail later.

The driving unit 200 may further include a block 240 located above the upper plate 205, a load sensor 241 located above the block 240, and a contact ring 242 located above the load sensor 241.

The block 240 may extend upward at a position corresponding to a vertex of the upper plate 205. In other words, the block 240 may be located outside the upper frame 245.

The load sensor 241 may be provided on the upper side of the block 240. In other words, the block 240 may serve to fix and support the load sensor 241 and the contact ring 242.

The load sensor 241 may be connected to the contact ring 242 and may be provided with a plurality of sensors for detecting the load by the force transmitted from the contact ring 242. The block 240 may be provided in a number corresponding to the number of the load sensors 241.

The load sensor 241 may include a first load sensor 241$a$, a second load sensor 241$b$, a third load sensor 241$c$, and a fourth load sensor 241$d$ to correspond to the vertices of the upper plate 205.

In addition, the block 240 may include a first block 240$a$ connected downwardly to an inner end of the first load sensor 241$a$, a second block connected downwardly to an inner end of the second load sensor 241$b$, a third block 240$c$ connected downwardly to the inner end of the third load sensor 241$c$, and the fourth block 240$d$ connected downwardly to the inner end of the fourth load sensor 241$d$.

The first to fourth load sensors 241 may be located outside the upper plate 205. The contact rings 242 may be connected to the first to fourth load sensors 241 along the outer ends of the first to fourth load sensors 241.

The contact ring 242 may be seated in an outward direction along the upper-end portions of the first to fourth load sensors 241. The contact ring 242 may be spaced outwardly above the block 240.

The contact ring 242 may be formed in a ring shape with a hollow. The outer diameter of the contact ring 242 may be formed to be relatively large so that the upper plate 205 may be located inside the contact ring 242. The contact ring 242 may be connected to the lower case 25. Therefore, when a collision of the lower module 20 occurs, it is possible to effectively reduce the amount of impact delivered to the inside of the lower module 20.

The load sensor 241 and the contact ring 242 detect a collision of the lower module 20 and serve to control the traveling operation. In detail, at the time of the collision of the lower module 20, the contact ring 242 may be distorted by the impact transmitted by the lower case 25. In other words, the contact ring 242 may generate momentum, and the load sensor 241 may detect the momentum and transmit a signal. At this time, the controller may control the rolling motion of the traveling unit 210 to be stopped by receiving the signal of the load sensor 241. According to such a configuration, there is an effect which can improve the safety by the traveling of the said guidance robot 1.

Meanwhile, the low plate 203 may be connected to the traveling unit 210. The traveling unit 210 may include a main wheel 211, an auxiliary wheel 212, and a suspension (not illustrated) so that the lower module 20 can be easily moved.

The suspension (not illustrated) may be located at both sides of the low plate 203. In detail, the suspension may be coupled to both side end portions of the low plate 203, respectively. In addition, the suspension may connect the main wheel 211 to the outside.

The main wheel 211 may be connected to both sides of the low plate 203. In detail, the main wheel 211 may be connected to a motor assembly (not illustrated) located on the bottom surface of the row plate 203. In addition, the motor may provide rotational force to the main wheel 211 by receiving the power from the battery 201 and rotating. The main wheel 211 may be provided with the rotational force of the motor to perform a rolling motion, thereby being capable of traveling the lower module 20. In addition, as described above, the main wheel 211 may be connected to the suspension and located to the outside of the suspension, respectively.

The auxiliary wheels 212 may be located below the low plate 203. In detail, the auxiliary wheel 212 may be coupled to the auxiliary wheel plate connected to the lower sides of the front and rear ends of the low plate 203, respectively. A plurality of auxiliary wheels 212 may be provided. The plurality of auxiliary wheels 212 may stably support the lower module 20 in the front and rear direction of the lower surface of the low plate 203. In other words, the auxiliary wheel 212 may serve to hold the center of the lower module 20 so that the traveling of the lower module 20 is made stable.

The auxiliary wheel 212 may be dependent on the main wheel 211 rotated by the motor to perform a rolling motion when the traveling is performed. In other words, the auxiliary wheel 212 does not rotate independently, it may be dependent on the rotation of the external force or the main wheel 211 to perform the rolling motion. The auxiliary wheel 212 may include a caster.

Meanwhile, the lower module 20 may further include a front rider 233 and a rear rider 234. The front rider 233 and the rear rider 234 are laser radars and are sensors for irradiating a laser beam, collecting and analyzing back scattered light among light absorbed or scattered by an aerosol to perform position recognition.

The front rider 233 may be located to face the front of the guidance robot 1 on the upper surface of the upper plate 205. For example, the front rider 233 may be located at the front end central portion of the upper plate 205. Therefore, the front rider 233 may be exposed to the outside through the first cutout 31.

The rear rider 234 may be located to face the rear of the guidance robot 1 on the upper surface of the low plate 203. For example, the rear rider 234 may be located at the rear end central portion of the low plate 203. Therefore, the rear rider 234 may be exposed to the outside through the second cutout 32. In addition, the front rider 233 may be located above the rear rider 234.

Hereinafter, the internal air circulation of the upper module described above will be described in more detail with reference to the accompanying drawings.

FIG. 13 is a view illustrating internal air flow A of the upper module according to an embodiment of the present disclosure.

Referring to FIG. 13, the internal air flow A of the upper module 10 is generated by driving the first cooling fan 103$a$ and the second cooling fan 103$b$. For example, the first cooling fan 103$a$ and the second cooling fan 103$b$ may rotate in one direction. When the first cooling fan 103$a$ and the second cooling fan 103$b$ are driven, outside air may be suctioned into the upper case 15 through an air flow hole 33 formed between the lower end portion of the head case 185 and the upper-end portion of the upper case 15.

The air suctioned into the upper case 15 is moved downward by forced convection by driving the first cooling fan 103a and the second cooling fan 103b. At this time, the air moved downward cools the main PC 127, the main board 121, and the communication device 122, while passing through the main PC 127, the main board 121, the communication device 122, or the like disposed inside the upper case 15.

After air cooling the electronic components passes through the middle plate 120, the air can be discharged to the outside of the upper case 15 through a first cutout 31 formed at an upper-end of the lower case 25.

In this case, since the first opening 128a and the fourth opening 128d of the middle plate 120 overlap the first cooling fan 103a and the second cooling fan 103b in the height direction, respectively, the flow rate of air flowing through the inside of the upper case 15 may be increased. Therefore, since the air inside the upper case 1 can quickly circulate inside the upper module 10, there is an advantage that the rapid cooling of the electronic components that generate high-temperature heat is possible.

FIG. 14 is a view illustrating the internal air flow B of the upper module according to another embodiment of the present disclosure.

Referring to FIG. 14, the internal air flow B of the upper module 10 according to another embodiment of the present disclosure is generated by driving the first cooling fan 103a and the second cooling fan 103b. Here, the first cooling fan 103a and the second cooling fan 103b may rotate in different directions from each other. When the first cooling fan 103a and the second cooling fan 103b are driven to rotate in different directions from each other, outside air can be suctioned into the upper case 15 through one side of the first cutout 31 formed at the upper-end of the lower case 25.

In more detail, when the first cooling fan 103a and the second cooling fan 103b are rotated in different directions from each other, one cooling fan of the two cooling fans forms a suction flow path, and the other cooling fan forms discharge flow path. For example, when the first cooling fan 103a and the second cooling fan 103b are rotated in different directions from each other, the second cooling fan 103b suctions outside air into the upper case 15, and the first cooling fan 103a guides so as to discharge the air suctioned into the upper case 15 to the outside.

In other words, outside air may be suctioned into the upper case 15 through one side of the first cutout 31 adjacent to the second cooling fan 103b. At this time, while the air suctioned into the upper case 15 passes through the main PC 127, the main board 121, the communication device 122, or the like disposed in the upper case 15, the air cools the main PC 127, the main board 121, and the communication device 122. In addition, the air cooling the electronic components may be discharged to the other side of the first cutout 31 through the first cooling fan 103a.

At this time, the air suctioned through the second cooling fan 103b may pass through the third opening 128c and the fourth opening 128d formed in the middle plate 120. In addition, the air passing through the third opening 128c and the fourth opening 128d may continuously pass through the first opening 128a and the second opening 128b formed in the middle plate 120.

In other words, since the air suctioned by the second cooling fan 103b is changed in the flow direction through a plurality of openings formed in the middle plate 120, there is an advantage that the cooling efficiency of the electronic component disposed inside the upper case 15 is improved.

In addition, since the first opening 128a and the fourth opening 128d of the middle plate 120 are disposed to overlap with the first cooling fan 103a and the second cooling fan 103b in the height direction, respectively, the flow rate of air flowing through the inside of the upper case 15 may be increased. Therefore, since the air inside the upper case 1 can quickly circulate inside the upper module 10, there is an advantage that the rapid cooling of the electronic components that generate high-temperature heat is possible.

In addition, according to the present embodiment, since the air circulation flow path can be selectively set only by controlling the rotation direction of the cooling fan, there is an effect of intensive cooling of the densely packed regions of the electronic components generating high-temperature heat.

In the present embodiment, it is described that the second cooling fan 103b forms the suction flow path of air, and the first cooling fan 103a forms the discharge flow path of air, but the present disclosure is not limited thereto, and it goes without saying that the first cooling fan 103a forms the suction flow path of air and the second cooling fan 103b forms the discharge flow path of air.

The invention claimed is:

1. A guidance robot comprising:
   a display;
   a head case configured to be provided to be capable of rotating;
   an upper case configured to couple to the display and the head case, the upper case being configured to receive an electronic component and a cooling fan therein; and
   a lower case configured to be located on a lower side of the upper case, the lower case being configured to locate a wheel and a motor therein,
   wherein, when the cooling fan is driven, outside air is suctioned through a gap between a lower end portion of the head case and an upper-end portion of the upper case, and the suctioned air passes through the electronic component and then is discharged to the outside through the gap between the lower end portion of the upper case and the upper-end portion of the lower case.

2. The guidance robot of claim 1, further comprising:
   a base plate configured to be located inside the upper case, the base plate being configured to dispose the cooling fan thereon; and
   a middle plate configured to be located above the base plate, the middle plate being configured to dispose the electronic component therein;
   wherein an opening through which the air suctioned into the upper case passes is formed in the middle plate.

3. The guidance robot of claim 2, wherein the opening is located to overlap the cooling fan in a vertical direction.

4. The guidance robot of claim 2, further comprising:
   an upper plate configured to be located inside the lower case, the upper plate being configured to dispose a rider for autonomous driving,
   wherein the upper portion of the lower case is formed with a cutout to be cut along a circumference of the lower case for the operation of the rider.

5. The guidance robot of claim 4, wherein the air suctioned through the gap between the lower end portion of the head case and the upper-end portion of the upper case is discharged to the outside through the cutout after passing through the cooling fan.

6. The guidance robot of claim 2, wherein a pair of cooling fans are provided, and
wherein the base plate is disposed to be adjacent to the lower end portion of the upper case.

7. The guidance robot of claim 6, wherein the pair of cooling fans have the same rotation direction as each other.

8. The guidance robot of claim 6, wherein rotation directions of the pair of cooling fans are directions opposite to each other.

9. The guidance robot of claim 8, wherein one of the pair of cooling fans guides so as to suction the outside air to the inside of the upper case, and
wherein the other thereof guides to discharge the air suctioned into the inside of the upper case to the outside.

10. The guidance robot of claim 2, wherein the base plate is formed to have a diameter larger than the diameter of the middle plate.

11. The guidance robot of claim 2, further comprising:
a subframe configured to connect the base plate and the middle plate,
wherein the subframe is formed perpendicular to the upper surface of the base plate.

12. The guidance robot of claim 11, further comprising:
a top plate configured to be located above the middle plate, the top plate being configured to support the head case; and
a main frame configured to connect the middle plate and the top plate,
wherein the main frame is formed perpendicular to the upper surface of the middle plate.

13. The guidance robot of claim 12, further comprising:
a PC supporter configured to be coupled to the main frame,
wherein the PC supporter holds and supports a main PC.

* * * * *